United States Patent
Cheng et al.

(10) Patent No.: US 10,043,746 B1
(45) Date of Patent: Aug. 7, 2018

(54) FABRICATION OF VERTICAL FUSES FROM VERTICAL FINS

(71) Applicant: INTERNATIONAL BUSINESS MACHINES CORPORATION, Armonk, NY (US)

(72) Inventors: Kangguo Cheng, Schenectady, NY (US); James J. Demarest, Rensselaer, NY (US); Juntao Li, Cohoes, NY (US)

(73) Assignee: International Business Machines Corporation, Armonk, CA (US)

( * ) Notice: Subject to any disclaimer, the term of this patent is extended or adjusted under 35 U.S.C. 154(b) by 0 days.

(21) Appl. No.: 15/425,589

(22) Filed: Feb. 6, 2017

(51) Int. Cl.
| | | |
|---|---|---|
| H01L 21/76 | (2006.01) |
| H01L 29/78 | (2006.01) |
| H01L 23/525 | (2006.01) |
| H01L 29/66 | (2006.01) |
| H01L 29/45 | (2006.01) |
| H01L 21/768 | (2006.01) |
| H01L 21/3205 | (2006.01) |
| H01L 21/306 | (2006.01) |
| H01L 21/8234 | (2006.01) |

(52) U.S. Cl.
CPC .... *H01L 23/5256* (2013.01); *H01L 21/30604* (2013.01); *H01L 21/32053* (2013.01); *H01L 21/76889* (2013.01); *H01L 21/823431* (2013.01); *H01L 29/456* (2013.01); *H01L 29/66795* (2013.01); *H01L 29/785* (2013.01)

(58) Field of Classification Search
CPC ....... H01L 29/45; H01L 29/456; H01L 29/66; H01L 29/667; H01L 29/6679; H01L 29/66795; H01L 29/78; H01L 29/785; H01L 23/52; H01L 23/525; H01L 23/5256; H01L 21/30; H01L 21/32; H01L 21/76; H01L 21/82
USPC ........................................................ 257/379
See application file for complete search history.

(56) References Cited

U.S. PATENT DOCUMENTS

| | | | |
|---|---|---|---|
| 6,387,781 B1 * | 5/2002 | Fathauer ........... | H01L 21/28518 257/E21.165 |
| 8,841,208 B2 | 9/2014 | Bao et al. | |
| 9,064,871 B2 | 6/2015 | Bao et al. | |
| 9,219,040 B2 | 12/2015 | Mann et al. | |
| 9,263,385 B1 | 2/2016 | Singh et al. | |
| 9,728,542 B1 * | 8/2017 | Balakrishnan .... | H01L 27/11206 |
| 2013/0001741 A1 | 1/2013 | Mann et al. | |
| 2015/0137312 A1 | 5/2015 | Bonilla et al. | |

* cited by examiner

*Primary Examiner* — Monica D Harrison
(74) *Attorney, Agent, or Firm* — Tutunjian & Bitetto, P.C.; Vazken Alexanian

(57) ABSTRACT

A vertical fuse element, including, a conductive silicide base on a surface of a substrate, and a conductive silicide pillar extending in a direction perpendicular to the surface of the substrate, where the conductive silicide pillar is on the conductive silicide base, and wherein the conductive silicide pillar includes an upper portion having a width, $W_5$, a base having a width, $W_6$, and a neck region having a width, $W_7$, where $W_7 < W_5$, and $W_7 \leq W_6$.

20 Claims, 13 Drawing Sheets

FABRICATION OF VERTICAL FUSES FROM VERTICAL FINS

BACKGROUND

Technical Field

The present invention generally relates to formation of a fuse structure from a vertical fin, and more particularly to vertically integrated addressable fuse elements as part of a fuse array.

Description of the Related Art

Fuses can be used in semiconductor circuits for various purposes, for example, redundancy circuits in memory arrays and devices, and programming of programmable logic arrays. Fuses have typically been implemented in semiconductors using polysilicon or metal as the fuse material. A blown fuse shows a very large increase in resistance. Current to blow such fuses can be exceptionally large, and electro-migration can cause a conductive path to be reformed across a blown metal fuse.

Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a typical planar FET with a single gate parallel to the plane of the substrate. Depending on the doping of the source and drain, an n-FET or a p-FET can be formed.

SUMMARY

In accordance with an embodiment of the present invention, a vertical fuse element, including, a conductive silicide base on a surface of a substrate, and a conductive silicide pillar extending in a direction perpendicular to the surface of the substrate, where the conductive silicide pillar is on the conductive silicide base, and wherein the conductive silicide pillar includes an upper portion having a width, $W_5$, a base having a width, $W_6$, and a neck region having a width, $W_7$, where $W_7 < W_5$, and $W_7 \leq W_6$ is provided.

In accordance with another embodiment of the present invention, a method of forming a vertical fuse element, including, forming a vertical fin on a substrate, forming a fin cap on the vertical fin, where the fin cap covers an upper portion of the vertical fin and leaves a lower portion of the vertical fin exposed, and reducing the width of the lower portion of the vertical fin to form a neck region between the upper portion and the lower portion of the vertical fin is provided.

In accordance with yet another embodiment of the present invention, a method of forming an array of vertical fuse elements on a first region of a substrate adjacent to a second region of the substrate having fin field effect transistors, including, forming a plurality of vertical fins on the substrate; forming a blocking layer on the plurality of vertical fins; removing a portion of the blocking layer from the first region of the substrate to expose one or more vertical fins on the first region of the substrate, where the first region is adjacent to the second region of the substrate having one or more vertical fins covered by a remaining portion of the blocking layer; forming a fin cap on each of the exposed one or more vertical fins, where a lower portion of the one or more vertical fins remains exposed after formation of the fin cap(s) on each of the exposed one or more vertical fins; reacting the exposed lower portion of the one or more vertical fins to form a sacrificial layer on the exposed lower portion of each of the one or more vertical fins; and removing the sacrificial layer from the lower portion of each of the one or more vertical fins to form a neck region in each of the one or more vertical fins is provided.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
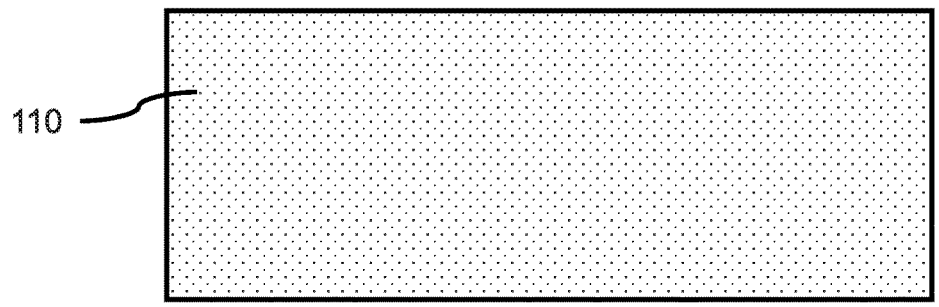
FIG. 1 is a cross-sectional side view showing a substrate, in accordance with an embodiment of the present invention.

Principles and embodiments of the present invention relate generally to forming fuse structures during front end of line (FEOL) processing utilizing semiconductor features and process steps that can also be used to form transistors devices. The fuse structures can be formed using fabrication processes that are also used to form other semiconductor devices of approximately the same size on the same substrate. In various embodiments, a vertical fin that can form a horizontal or vertical channel of a field effect transistor (FET) can be utilized to form a vertical fuse element by modifying the vertical fin's physical structure and chemical composition. The vertical fin(s) having a fuse structure can form vertical fuse elements.

Principles and embodiments of the present invention also relates generally to an array of fuse elements on a region of a substrate adjacent to a region of fin field effect transistors (FinFETS), where the vertical fuse elements can be electrically coupled to the FinFETS. The combination of FinFETS and fuse elements on the same substrate can provide on-chip non-volatile memory.

Principles and embodiments of the present invention also relate generally to an addressable array of fuse elements, where one or more fuse elements of the array may be selectively blown (i.e., form an open circuit state), for example, to program an electrically programmable read-only memory (EPROM), or to configure circuits and/or program functionality into an application specific integrated circuit (ASIC), or to electrically decouple portions of memory identified as bad sectors from a memory circuit.

Blowing a fuse element can cause an associated memory bit to read as a '0'.

Exemplary applications/uses to which the present invention can be applied include, but are not limited to: non-volatile memory, including, electrically programmable read-only memory (EPROM), field programmable read-only memory (FPROM), application specific integrated circuits (ASICs), and as a fingerprinting feature of a device. The fuse elements and/or array of fuse elements can be implemented to form a predetermined pattern of open and closed electrical paths that can uniquely identify a device, a portion or a device, or a function of a device, where the pattern of blown and unblown fuses can function as an electrical or digital fingerprint (e.g., a group of parallel voltages/currents or a sequence of "1"s and "0"s). The fingerprint may be used for theft prevention and identification.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer may be formed by a first process (e.g., ALD, PEALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps can be varied within the scope of the present invention.

It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a cross-sectional side view of a substrate is shown, in accordance with an embodiment of the present invention.

In one or more embodiments, a substrate 110 can be a semiconductor or an insulator with an active surface semiconductor layer. The substrate can include crystalline, semi-crystalline, microcrystalline, or amorphous regions. The substrate can be essentially (i.e., except for contaminants) a single element (e.g., silicon), primarily (i.e., with doping) of a single element, for example, silicon (Si) or germanium (Ge), or the substrate can include a compound, for example, Al$_2$O$_3$, SiO$_2$, GaAs, SiC, or SiGe. The substrate can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides.

In one or more embodiments, the substrate 110 can be a silicon wafer. In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

Figure 2:
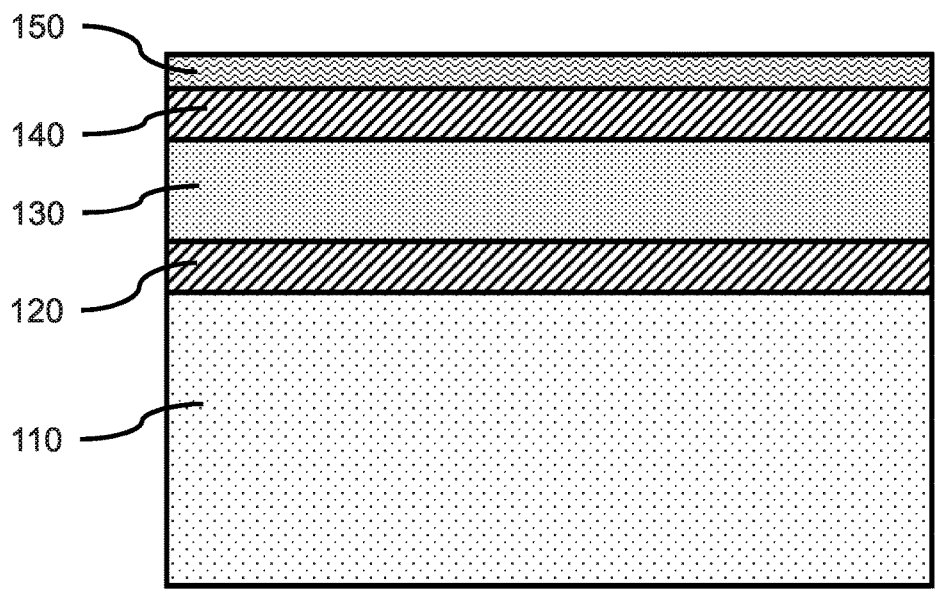
FIG. 2 is a cross-sectional side view showing a fin template layer formed on the surface of the substrate, a mandrel layer formed on the fin template layer, a mandrel template layer formed on the mandrel layer, and a mandrel mask layer formed on the mandrel template layer, in accordance with an embodiment of the present invention.

FIG. 2 is a cross-sectional side view showing a fin template layer formed on the surface of the substrate, a mandrel layer formed on the fin template layer, a mandrel template layer formed on the mandrel layer, and a mandrel mask layer formed on the mandrel template layer, in accordance with an embodiment of the present invention In one or more embodiments, a fin template layer 120 can be formed on at least a portion of a surface of a substrate 110. In various embodiments, the fin template layer 120 can be formed on the substrate surface by CVD, PECVD, PVD, thermal growth, or combinations thereof, where the fin template layer 120 can be blanket deposited on the substrate.

In one or more embodiments, the fin template layer 120 can have a thickness in the range of about 20 nm to about 70 nm, or in the range of about 20 nm to about 50 nm, or in the range of about 50 nm to about 70 nm, or in the range of about 30 nm to about 60 nm, where the thickness of the fin template layer 120 can define the height of subsequently formed source/drain projections. Other thicknesses are also contemplated.

In various embodiments, a fin template layer 120 can be a hard mask layer for masking the substrate during transfer of a vertical fin pattern to the substrate 110. The fin template layer 120 can be silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), boron carbide (BC), boron nitride (BN), titanium nitride (TiN), or combinations thereof, where the fin template layer 120 may include one or more layers. The fin template layer 120 can also act as an etch-stop layer for forming sacrificial mandrels from a mandrel layer.

In one or more embodiments, a mandrel layer 130 can be formed on at least a portion of the fin template layer 120. In one or more embodiments, the mandrel layer 130 can be formed by CVD, PECVD, PVD, a spin-on process, or combinations thereof, where the mandrel layer 130 can be blanket deposited on the fin template layer 120.

In various embodiments, mandrel layer 130 can be a sacrificial material that can be easily and selectively patterned and etched. The mandrel layer 130 can be amorphous silicon (a-Si), poly-silicon (p-Si), amorphous carbon (a-C), silicon-germanium (SiGe), an organic planarization layer (OPL), silicon oxide (SiO), silicon nitride (SiN), or suitable combinations thereof.

In one or more embodiments, a mandrel template layer 140 can be formed on the mandrel layer 130, where the mandrel template layer can be a hard mask layer.

The mandrel template layer 140 can be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof, where the mandrel template layer 140 may include one or more layers.

In one or more embodiments, a mandrel mask layer 150 can be formed on the mandrel template layer 140, where the mandrel mask layer 150 can be a hard mask layer or soft mask layer for masking the mandrel template layer 140. In one or more embodiments, the mandrel mask layer 150 can be a lithographic resist material (e.g., a photo resist material, an e-beam resist material, etc.).

In one or more embodiments, the mandrel mask layer 150 can be a positive or negative resist material, for example, Poly (methyl methacrylate) (PMMA) or SU-8, or an electron-beam (e-beam) cured material, for example, hydrogen silsesquioxane (HSQ).

In one or more embodiments, the mandrel mask layer 150 can be formed on the mandrel template layer 140 by a spin on process.

Figure 3:
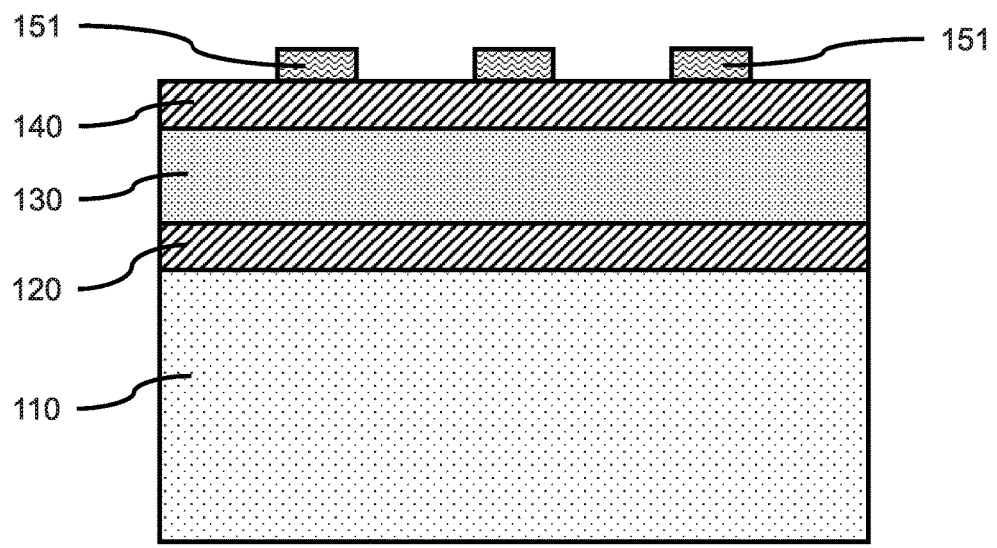
FIG. 3 is a cross-sectional side view showing a patterned mandrel mask layer on the mandrel template layer, in accordance with an embodiment of the present invention.

FIG. 3 is a cross-sectional side view showing a patterned mandrel mask layer on the mandrel template layer, in accordance with an embodiment of the present invention In one or more embodiments, the mandrel mask layer 150 can be patterned and developed to form mandrel mask segments 151 on the mandrel template layer 140, where the mandrel mask segments 151 cover portions of the mandrel template layer 140 and expose other portions of the mandrel template layer. The mandrel mask layer 150 can be patterned and developed using processes known in the art.

In various embodiments, the pitch (i.e., center-to-center distance) between adjacent mandrel mask segments 151 can be in the range of about 20 nm to about 60 nm, or in the range of about 20 nm to about 40 nm, or in the range of about 25 nm to about 30 nm, which can determine the pitch between vertical fins.

Figure 4:
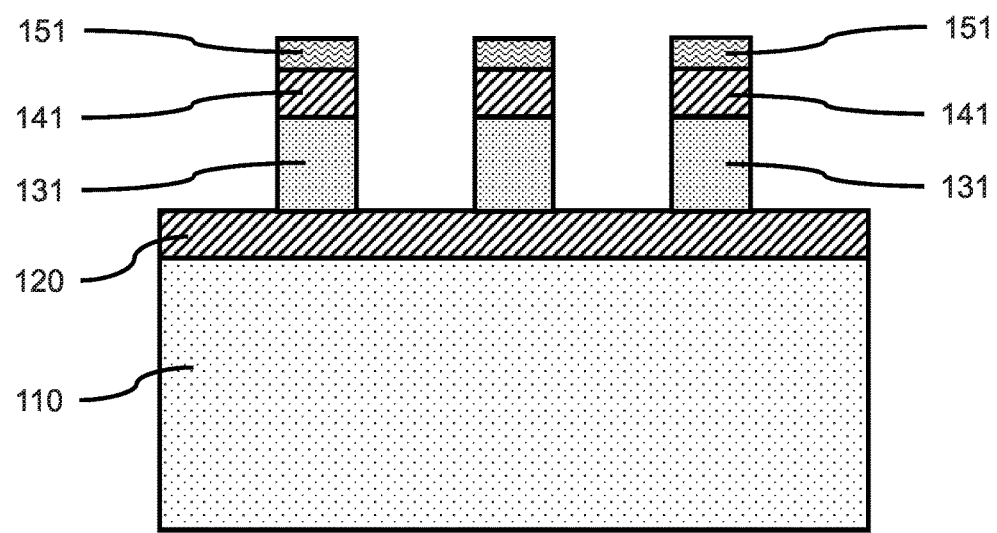
FIG. 4 is a cross-sectional side view showing a patterned mandrel mask layer on the mandrel templates and sacrificial mandrels, in accordance with an embodiment of the present invention.

FIG. 4 is a cross-sectional side view showing a patterned mandrel mask layer on the mandrel templates and sacrificial mandrels, in accordance with an embodiment of the present invention.

In one or more embodiments, the exposed portions of the mandrel template layer 140 can be removed by wet etching or by a dry plasma etch, where the dry plasma can be a directional reactive ion etch (RIE). Removal of the exposed portions of the mandrel template layer 140 can form one or more mandrel templates 141 below the mandrel mask segments 151, and expose underlying portions of the mandrel layer 130. The mandrel templates 141 can be used to transfer the mandrel pattern to the mandrel layer 130.

In one or more embodiments, once the mandrel templates 141 are formed, a directional etch (e.g., RIE) can be used to remove exposed portions of the mandrel layer 130 to form sacrificial mandrels 131 on the underlying fin template layer 120. The one or more sacrificial mandrels 131 can be on the fin template layer 120, where portions of the fin template layer can be exposed between the sacrificial mandrel(s) 131.

Figure 5:
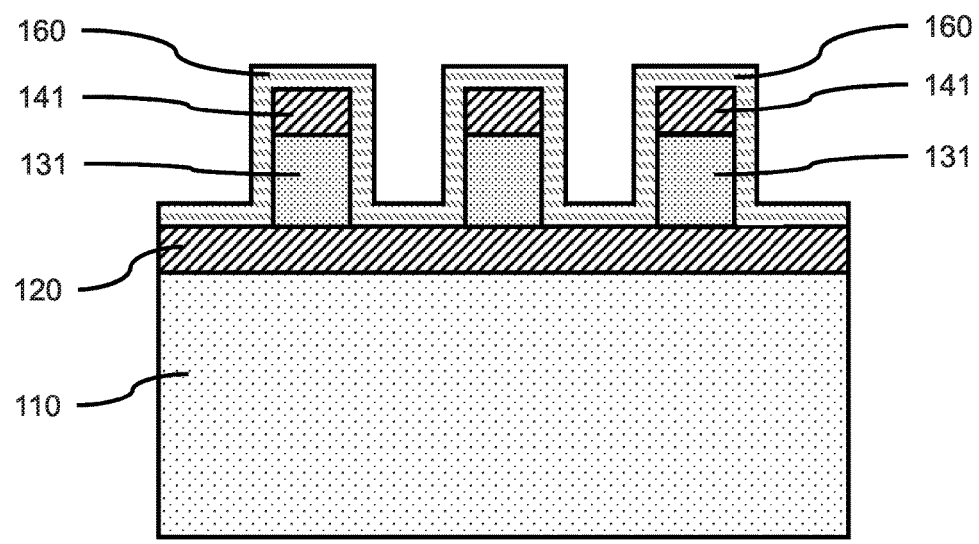
FIG. 5 is a cross-sectional side view showing a sidewall layer formed on the mandrel templates, sacrificial mandrels, and fin template layer, in accordance with an embodiment of the present invention.

FIG. 5 is a cross-sectional side view showing a sidewall layer formed on the mandrel templates, sacrificial mandrels, and fin template layer, in accordance with an embodiment of the present invention.

In one or more embodiments, the mandrel mask segments 151 can be removed to expose the mandrel templates 141 using a process known in the art (e.g., stripping or ashing).

In one or more embodiments, a sidewall spacer layer 160 can be formed on the exposed surfaces of the mandrel templates 141 and sacrificial mandrels 131, where the sidewall spacer layer 160 can be formed by a conformal deposition, for example, ALD or PEALD, to control the thickness of the sidewall spacer layer 160. Sidewall spacer(s) with a greater or lesser thickness can also be formed and used.

In various embodiments, the sidewall spacer layer 160 can have a thickness in the range of about 4 nm to about 20 nm, or in the range of about 6 nm to about 15 nm, or in the range of about 8 nm to about 12 nm, where the thickness of the spacer layer can determine the pitch and/or width of subsequently formed vertical fins. A sidewall spacer layer with greater thicknesses or lesser thicknesses are also contemplated.

In various embodiments, the sidewall spacer layer 160 can be silicon oxide (SiO), silicon nitride (SiN), silicon oxynitride (SiON), or combinations thereof.

Figure 6:
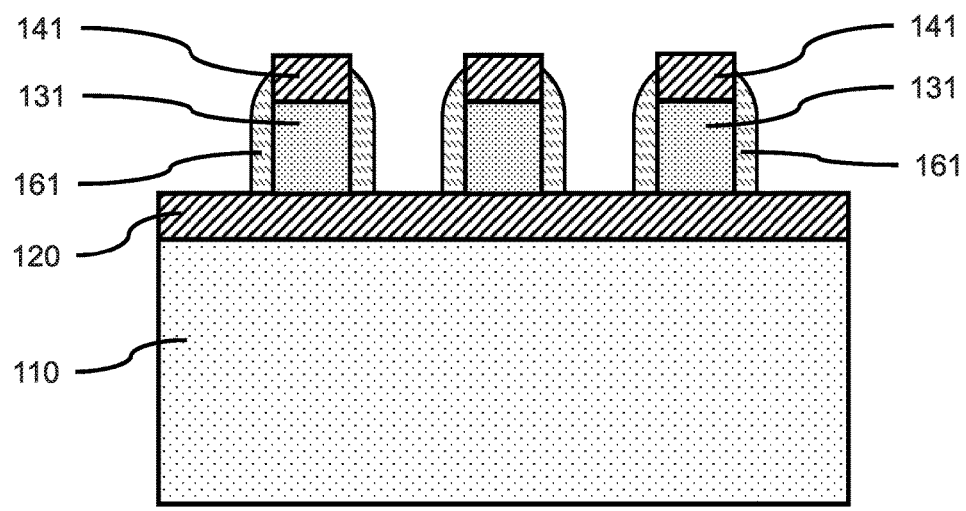
FIG. 6 is a cross-sectional side view showing sidewalls spacers formed on opposite sides of the sacrificial mandrels, in accordance with an embodiment of the present invention.

FIG. 6 is a cross-sectional side view showing sidewalls spacers formed on opposite sides of the sacrificial mandrels, in accordance with an embodiment of the present invention.

In one or more embodiments, a portion of the sidewall spacer layer 160 on the fin template layer 120 and the top surfaces of the mandrel templates 141 can be removed by an etch-back process using a directional etch, for example, RIE, to remove the portion of the sidewall spacer layer on surfaces approximately perpendicular to the incident ion beam, while the sidewall spacer layer 160 on the vertical sidewalls of the sacrificial mandrels 131 remain essentially unetched. In one or more embodiments, a portion of the sidewall spacer layer 160 on the top surfaces of the mandrel templates 141 can be removed by a chemical-mechanical polishing (CMP) to expose the underlying mandrel templates 141. The remaining portion of the sidewall spacer layer 160 on the sacrificial mandrels 131 can form sidewall spacers 161.

In various embodiments, a plurality of vertical fins can be formed by a sidewall image transfer (SIT) process, self-aligned double patterning (SADP), or self-aligned quadruple patterning (SAQP) to provide a tight pitch between vertical fins. In various embodiments, a direct print can be used to provide fins with a looser pitch.

Figure 7:
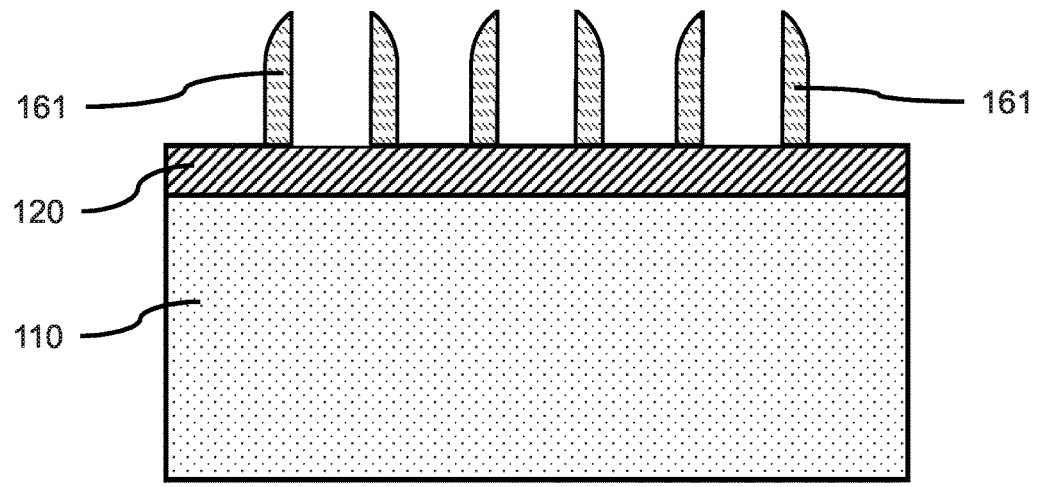
FIG. 7 is a cross-sectional side view showing sidewall spacers formed on the fin template layer after removal of the sacrificial mandrels, in accordance with an embodiment of the present invention.

FIG. 7 is a cross-sectional side view showing sidewall spacers formed on the fin template layer after removal of the sacrificial mandrels, in accordance with an embodiment of the present invention.

In one or more embodiments, the mandrel templates 141 and sacrificial mandrels 131 can be removed after the sidewalls spacers 161 are formed, where the mandrel templates 141 and sacrificial mandrels 131 can be removed by selective etching (e.g., RIE or wet etch). The mandrel templates 141 and sacrificial mandrels 131 can be selectively removed, while the sidewalls spacers 161 remain on the fin template layer 120 forming a fin pattern. The sidewalls spacers 161 can be made of a different material from the mandrel templates 141 and sacrificial mandrels 131, so the mandrel templates 141 and sacrificial mandrels 131 can be selectively removed.

Figure 8:
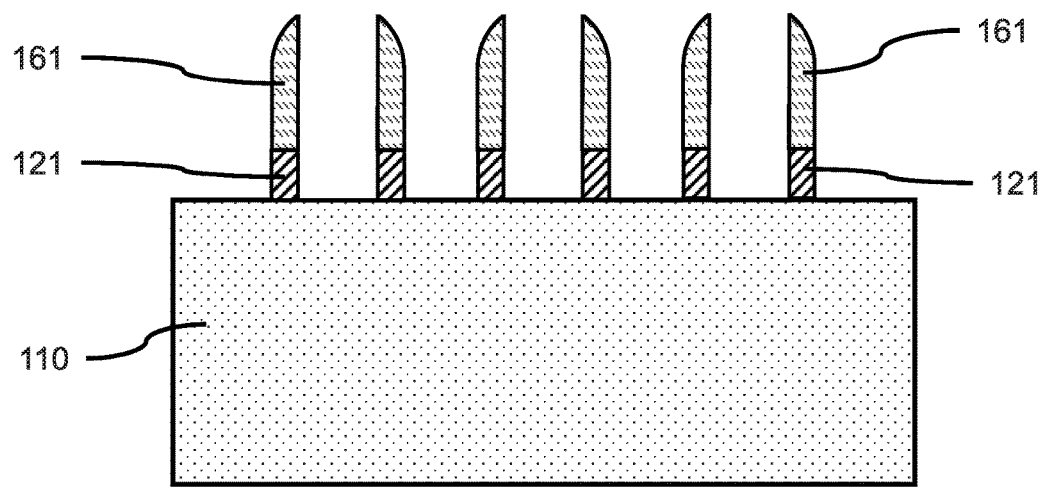
FIG. 8 is a cross-sectional side view showing fin templates formed on the substrate and sidewall spacers on each fin template, in accordance with an embodiment of the present invention.

FIG. 8 is a cross-sectional side view showing fin templates formed on the substrate and sidewall spacers on each fin template, in accordance with an embodiment of the present invention;

In one or more embodiments, the fin pattern formed by the sidewalls spacers 161 can be transferred to the fin template layer 120 by removing the exposed portion of the fin template layer 120. In various embodiments, a portion of the fin template layer 120 can be removed to form a fin template 121 below each of the one or more sidewall spacers 161 by a directional RIE. Removal of the portions of the fin template layer 120 can expose portions of the underlying substrate 110, surface/active layer(s), or source/drain layer(s) between each of the sidewall spacers 161 and fin templates 121.

Figure 9:
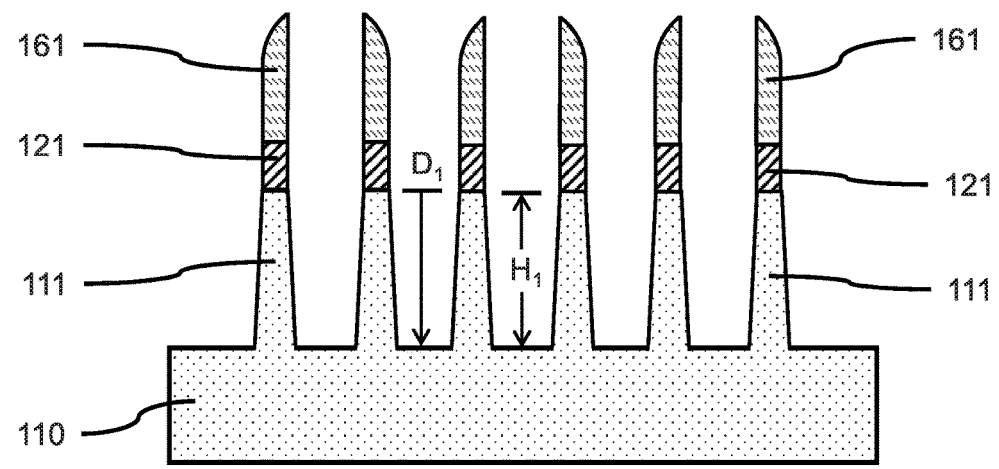
FIG. 9 is a cross-sectional side view showing a plurality of vertical fins formed on the substrate with a fin template and a sidewall spacer on each vertical fin, in accordance with an embodiment of the present invention.

FIG. 9 is a cross-sectional side view showing a plurality of vertical fins formed on the substrate with a fin template and a sidewall spacer on each vertical fin, in accordance with an embodiment of the present invention.

In one or more embodiments, one or more vertical fin(s) 111 can be formed on the substrate 110 or a surface active layer, where the vertical fin(s) 111 can be formed by removing a portion of the substrate 110 between and/or around a sidewall spacer 161 and fin template 121. The one or more vertical fin(s) 111 can be formed by a directional etch, for example, a reactive ion etch (RIE) that removes the portion of the substrate or surface active layer not covered by a sidewall spacer 161. The removal of the substrate material can form vertical fin(s) 111 with a tapered profile having a greater width at the base of the vertical fin(s) and a narrower width at the top of the fin(s), or with a straight profile (i.e., an essentially uniform width), where the straight or tapered profile can be produced as an aspect of the etching process.

In various embodiments, the substrate 110 or active surface layer can be a silicon-germanium (SiGe) layer and silicon fins can be epitaxially grown on the SiGe surface to provide strained vertical fins for at least a portion of the formed vertical fins 111.

In one or more embodiments, trenches can be formed in the substrate or surface active layer between and/or around a sidewall spacer 161 and fin template 121 to a depth, $D_1$, in the range of about 20 nm to about 150 nm, or in the range of about 30 nm to about 100 nm, or about 45 nm to about 60 nm, where the vertical fin(s) 111 formed in the substrate can have a resulting height, $H_1$, equal to the depth of the trench. Other depths and heights are also contemplated. The formed vertical fin(s) 111 can have a tapered profile with a width at the base 112 greater than the width of the sidewall spacer 161 and fin template 121 on the top surface 113 of the vertical fin(s), or the etching process can be controlled to provide vertical fin(s) 111 with essentially vertical sidewalls, such that the vertical fin width is substantially uniform along the fin height.

In non-limiting exemplary embodiments, the substrate 110 can be a single crystal silicon (Si) wafer or a single crystal silicon-germanium ($Si_xGe_y$) wafer, or the substrate can include a single crystal silicon (Si) or single crystal silicon-germanium active layer ($Si_xGe_y$) at the surface of the substrate 110 (i.e., surface active layer) from which a plurality of vertical fins can be formed.

In one or more embodiments, the vertical fin(s) 111 can have a length in the range of about 20 nm to about 60 nm, or about 30 nm to about 50 nm, where the vertical fin length can be equal to or greater than the width, $W_1$. The vertical fin(s) 111 can have a substantially (e.g., with rounded edges and rough/uneven surfaces) square or rectangular cross-section parallel with the plane of the substrate 110. In one or more embodiments, the vertical fin(s) 111 can have a height in the range of about 20 nm to about 150 nm, or in the range of about 30 nm to about 100 nm, or about 45 nm to about 60 nm, although other heights are contemplated.

In one or more embodiments, the height of the vertical fin(s) 111 on a first region of the substrate can be the same as the height of the vertical fin(s) 111 on a second region of the substrate that can be adjacent to the first region of the substrate. The vertical fin(s) 111 on the second region of the substrate can be longer than the vertical fin(s) on a first region. The vertical fin(s) 111 on a second region of the substrate may be covered with a protective blocking layer, while vertical fin(s) 111 on a first region of the substrate are processed to form vertical fuses. The vertical fin(s) 111 on the second region of the substrate may be used to fabricate one or more vertical transport fin field effect transistors (VT FinFETs). The VT FinFETs may be electrically coupled to one or more vertical fuses on the first region of the substrate or another adjacent region of the substrate. A plurality of vertical fuses on a first region of the substrate 110 can form a vertically integrated front end of line (FEOL) fuse array.

Figure 10:
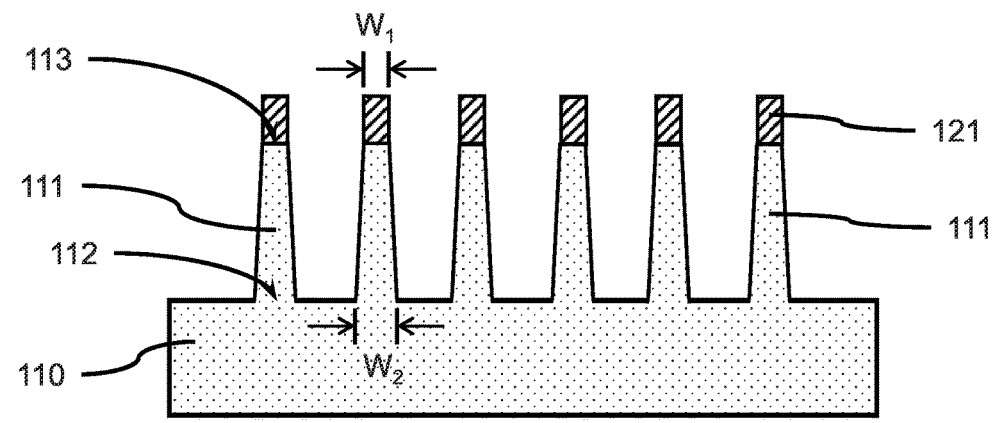
FIG. 10 is a cross-sectional side view showing a fin template remaining on each tapered vertical fin after removal of the sidewall spacers, in accordance with an embodiment of the present invention.

FIG. 10 is a cross-sectional side view showing a fin template remaining on each tapered vertical fin after removal of the sidewall spacers, in accordance with an embodiment of the present invention.

In one or more embodiments, the sidewall spacers 161 can be removed from the vertical fins 111 to expose the top surface of the fin templates 121 on the vertical fins. The vertical fins 111 can have tapered sidewall profiles, where the base 112 of a vertical fin 111 has a greater width, $W_2$, than the width, $W_1$, at the top surface 113 of the vertical fin 111. The sidewall spacers 161 can be removed, for example, by an isotropic dry etch, a selective RIE process, or a selective wet etch. The underlying fin template(s) 121 can act as an etch stop. The fin template(s) 121 can remain on the vertical fin(s) 111 after the sidewall spacers 161 are removed, and be removed by a separate selective etch.

In one or more embodiments, the width, $W_1$, at the top surface 113 of the vertical fin can be in the range of 10 nm to about 40 nm, and the width, $W_2$, at the base 112 of the vertical fin can be about 5 nm to about 40 nm wider than the width, $W_1$. In other embodiments, the width, $W_1$, at the top surface 113 of the vertical fin(s) 111 can be about the same as the width, $W_2$, at the base 112 of the vertical fin(s) with a vertical sidewall.

In various embodiments, a plurality of vertical fins 111 formed on the substrate 110 can be divided into two or more subsets where a first subset of vertical fins includes one or more vertical fins on a first region of the substrate, and a second subset of vertical fins includes one or more vertical fins of the plurality of vertical fins 111 on a second region of the substrate.

Figure 11:
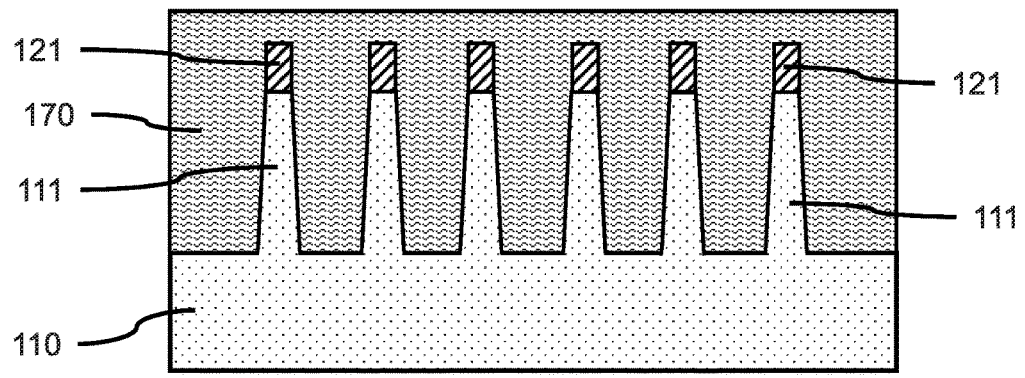
FIG. 11 is a cross-sectional side view showing a spacer layer on the vertical fins and substrate, in accordance with an embodiment of the present invention.

FIG. 11 is a cross-sectional side view showing a spacer layer on the vertical fins and substrate, in accordance with an embodiment of the present invention.

In one or more embodiments, a spacer layer 170 can be formed on the fin templates, vertical fin(s) 111, and exposed surface of the substrate, where the spacer layer 170 can be blanket deposited on the vertical fin(s) 111 and substrate, for example, by CVD, PECVD, LPCVD, a spin-on process, or combinations thereof. The spacer layer 170 may fill the spaces between adjacent vertical fins 111, extend above, and cover the top surfaces of the fin templates and sidewalls of the vertical fins.

In one or more embodiments, the spacer layer 170 can be a silicon oxide, a carbon-doped silicon oxide, a porous silicon oxide, a silicon nitride, a silicon oxynitride, or combinations thereof.

In one or more embodiments, a masking layer can be formed on at least a portion of the spacer layer 170, where the masking layer can cover one or more of the fin templates 121 and vertical fins in a second region of the substrate to act as a blocking layer. The masking layer can be located on at least a portion of the spacer layer 170, where at least the top surface of one or more fin templates is exposed in a first region of the substrate. The masking layer can be an organic lithography material that can be patterned and developed. The masking layer can be a positive or negative resist material.

Figure 12:
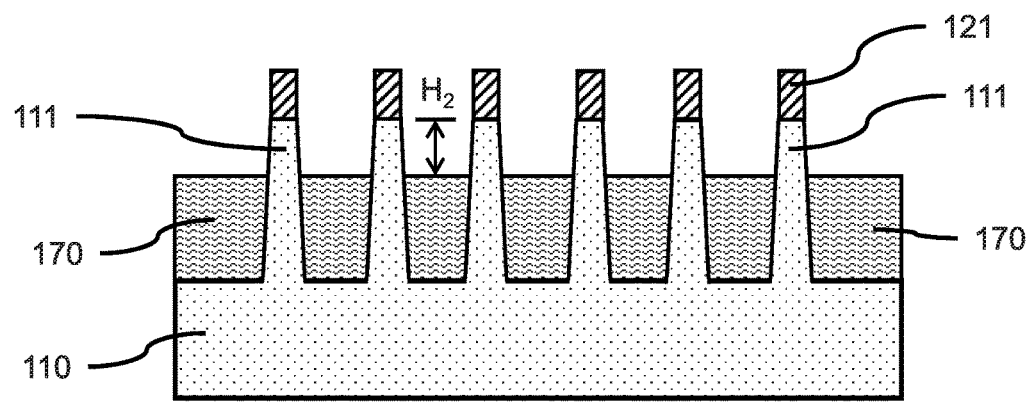
FIG. 12 is a cross-sectional side view showing a spacer layer with a reduced height exposing the fin templates and an upper portion of the vertical fins, in accordance with an embodiment of the present invention.

FIG. 12 is a cross-sectional side view showing a spacer layer with a reduced height exposing the fin templates and an upper portion of the vertical fins, in accordance with an embodiment of the present invention.

In one or more embodiments, the height of the spacer layer 170 can be reduced to below the top surface 113 of the vertical fin(s) 111, where the spacer layer 170 can be reduced within a first region of the substrate. A chemical-mechanical polishing can be used to remove the portion of the spacer layer 170 extending above the fin templates(s) 121, and a selective and/or directional etch (e.g., RIE, wet etch) can be used to remove additional material of the spacer layer 170 to reduce the height of the spacer layer below the top surface 113 of the vertical fin(s) 111.

In one or more embodiments, the height of the spacer layer 170 can be reduced to expose about an upper ⅓ portion (e.g., 30% to 37%) of the vertical fin height, while about a lower ⅔ portion of the vertical fin height remains covered by the spacer layer. In various embodiments, the spacer layer 170 can cover about 60% to about 70% of the height of the vertical fin(s) 111, while about 30% to about 40% of the upper portion of the vertical fin 111 is exposed.

In one or more embodiments, the upper portion of the vertical fin can have a height, $H_2$, above the surface of the spacer layer 170 in the range of about 5 nm to about 25 nm, or in the range of about 10 nm to about 15 nm, although other heights are contemplated.

In one or more embodiments, the vertical fins 111 can be a crystalline semiconductor with a predetermined crystal orientation, where removal of the one or more exposed fin templates 121 exposes a crystalline surface.

Figure 13:
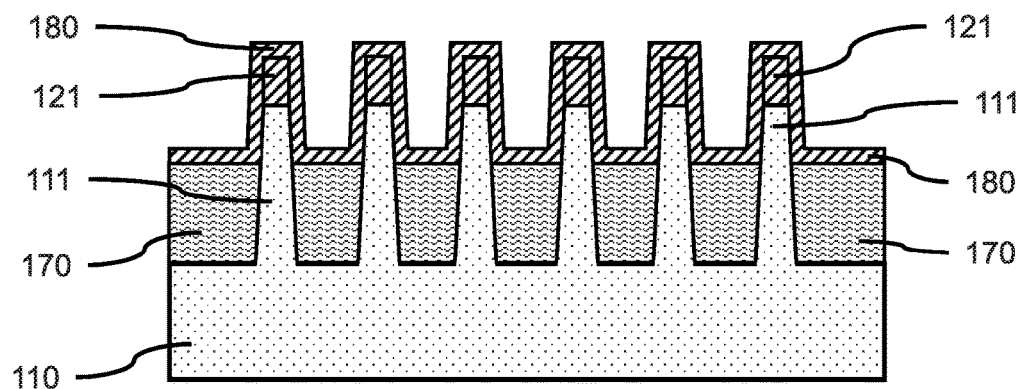
FIG. 13 is a cross-sectional side view showing a capping layer on the fin templates, and the exposed portions of the vertical fins and spacer layer, in accordance with an embodiment of the present invention.

FIG. 13 is a cross-sectional side view showing a capping layer on the fin templates, and the exposed portions of the vertical fins and spacer layer, in accordance with an embodiment of the present invention.

In one or more embodiments, a capping layer 180 can be formed on the exposed surfaces of the vertical fin(s) 111, fin template(s) 121, and spacer layer 170, where the capping layer 180 can be formed by ALD, PEALD, CVD, PECVD, or combinations thereof.

In various embodiments, a vertical fin 111 can be encapsulated by the fin template 121 on a top surface 113 and the capping layer 180 on the side and end surfaces of the vertical fins, where the capping layer is deposited on the exposed surfaces of the vertical fin 111, fin template 121, and spacer layer 170. The height of the fin template 121 can be greater than the thickness of the capping layer 180.

In one or more embodiments, the capping layer 180 can be silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), boron carbide (BC), a boron nitride (BN), or combinations thereof. In various embodiments, the fin template 121 and the capping layer 180 may be the same material, such that both the fin template 121 and the capping layer 180 have the same etch rate. The fin template 121 and the capping layer 180 may be made of materials that block oxygen diffusion (e.g., $Si_3N_4$) to avoid formation of a silicon oxide.

Figure 14:
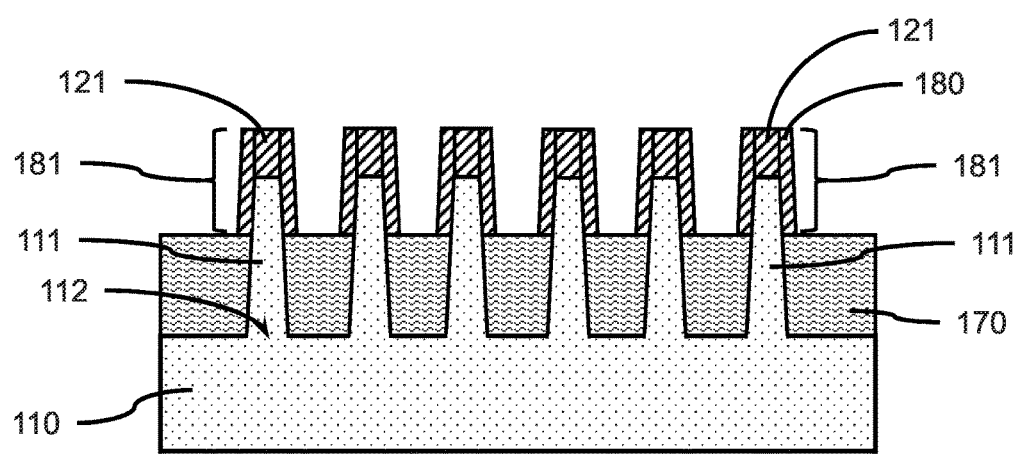
FIG. 14 is a cross-sectional side view showing fin caps on the upper portion of each vertical fin, in accordance with an embodiment of the present invention.

FIG. 14 is a cross-sectional side view showing fin caps on the upper portion of each vertical fin, in accordance with an embodiment of the present invention.

In one or more embodiments, a portion of the capping layer 180 can be removed to form fin cap(s) 181 on each of the vertical fin(s) 111, where the fin cap(s) 181 can include the fin template 121 and remaining portion of the capping layer 180 that covers the upper portion of each vertical fin 111. The capping layer 180 can be removed from the horizontal surfaces of the fin template 121 and spacer layer 170 through a selective, direction etch (e.g., RIE), where the exposed capping layer 180 material can be etched back to expose the underlying surfaces. The combination of the fin template 121 and remaining capping layer 180 on the fin template and side surfaces can form a fin cap 181 that covers the portion of the vertical fin 111 above the top surface of the spacer layer 170.

The fin template 121 and capping layer 180 can be the same material (e.g., silicon nitride (SiN)) or different materials.

In one or more embodiments, the spacer layer 170 can be removed to expose the sidewalls of the lower portion of the vertical fin(s) 111. The spacer layer 170 can be removed using an isotropic etch selective for the material of the spacer layer 170.

Figure 15:
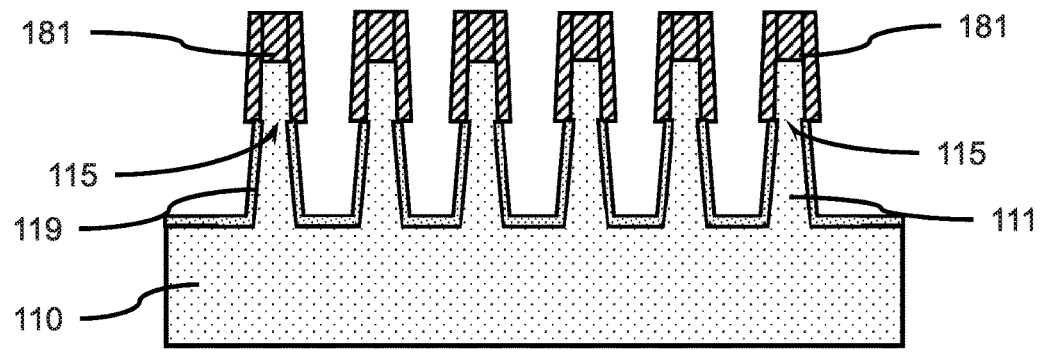
FIG. 15 is a cross-sectional side view showing a sacrificial layer formed on the sidewalls of each vertical fin, in accordance with an embodiment of the present invention.

FIG. 15 is a cross-sectional side view showing a sacrificial layer formed on the sidewalls of each vertical fin, in accordance with an embodiment of the present invention.

In one or more embodiments, a sacrificial layer 119 can be formed on the exposed sidewalls of the vertical fin(s) 111, where the formation of the sacrificial layer 119 can consume at least a portion of the vertical fin below the fin cap 181 to reduce the width (i.e. thickness) of the initial fin material. A portion of the exposed surface of the substrate 110 can be converted to the sacrificial layer 119, where the portion can be consumed to increase the depth of the trench adjacent to the verticals 111, and thereby increase the height of the vertical fins. In various embodiments, the sacrificial layer 119 can be thermally grown on the sidewalls of the vertical fin(s) 111 and the exposed substrate surface, for example by a thermal oxide growth process. Formation of the oxide can initially increase the thickness (i.e., width) of the vertical fins 111.

In a non-limiting exemplary embodiment, a silicon dioxide ($SiO_2$) sacrificial layer 119 can be grown on the sidewalls by consuming a surface portion of crystalline silicon (c-Si) vertical fin(s) 111, where the silicon dioxide ($SiO_2$) sacrificial layer 119 can be formed by thermal oxidation of the exposed vertical fin material. Formation of the sacrificial layer 119 can increase the width of the vertical fin 111 below the fin cap. The remaining width of a silicon vertical fin 111 can be less than the initial width after formation of the silicon dioxide sacrificial layer 119 due to conversion of an outer layer of the exposed vertical fin to the silicon dioxide ($SiO_2$).

Figure 16:
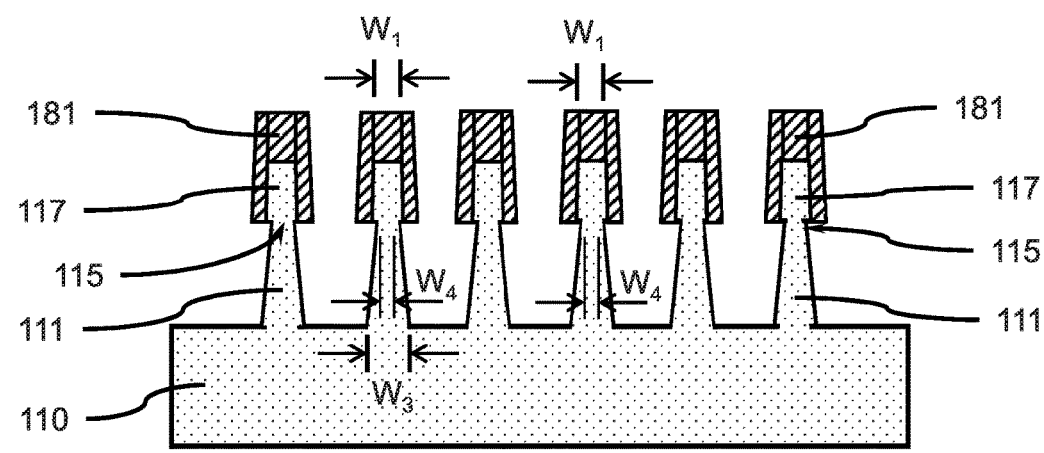
FIG. 16 is a cross-sectional side view showing a thinned vertical fin have a fuse structure after removal of the sacrificial layer on the sidewalls of each vertical fin, in accordance with an embodiment of the present invention.

FIG. 16 is a cross-sectional side view showing a thinned vertical fin have a fuse structure after removal of the sacrificial layer on the sidewalls of each vertical fin, in accordance with an embodiment of the present invention.

In one or more embodiments, the sacrificial layer 119 can be removed to reduce the width of the vertical fin(s) 111 to provide a narrower vertical fin having a base with a reduced width, $W_3$, and a neck region 115, where the neck region 115 has a width, $W_4$, less than the width, $W_1$, of the top surface 113 and reduced width, $W_3$, of the base 112 of the vertical fin 111. Removal of the sacrificial layer 119 below the upper portion 117 of the vertical fin(s) 111 can reduce the cross-sectional area of the lower portion of the vertical fin(s) 111. In various embodiments, the width, $W_4$, of the neck region 115 is less than both the reduced width, $W_3$, of the base 112 and the width, $W_1$, of the top surface 113. In various embodiments, the upper portion 117 of the vertical fin(s) 111 can have straight sidewalls instead of tapered sidewalls due to the fin forming process, such that the width, $W_1$, is essentially uniform for the upper portion 117.

In embodiments with a vertical fin 111 having straight sidewalls and a uniform width along the height of the vertical fin, the widths, $W_3$ and $W_4$, can be about the same after reduction of the vertical fin width. The neck region 115 may be formed by undercutting the fin cap(s) 181 by the isotropic etch.

In one or more embodiments, the sacrificial layer 119 can be removed using a selective isotropic etch (e.g., wet etch) to form a narrower section of the vertical fin 111 that has a region (e.g., neck region 115).

In one or more embodiments, the formation of the sacrificial layer 119 may be skipped and the width of the vertical fin 111 reduced by an isotropic etch (e.g., isotropic wet etch, dry etch, or plasma etch) that selectively removes material from the exposed surfaces of the vertical fin 111. The width of a lower portion of the vertical fin(s) 111 can be reduced by etching the lower portion of the vertical fin to remove a predetermined thickness from the side and end walls of the vertical fin(s).

In various embodiments, a portion of the vertical fin 111 is made narrower to create a structural change in a conductive path that increases resistance across at least a portion of the conductive path to form a fuse structure. The resulting fuse structure can provide an open circuit state or a closed circuit state depending on whether the conductive path through the fuse structure is interrupted or uninterrupted, respectively. The vertical fin having a fuse structure can form a fuse element in a circuit, where a fuse element has a fuse structure. The fuse element can be converted from a closed circuit state to and open circuit state by passing a sufficient current through the fuse structure at least momentarily to generate sufficient electromigration to form a gap in a conductive material at the neck region 115. A fuse element or an array of fuse elements can be programmed by selectively forming open circuit state(s) along predetermined conductive path(s) by blowing (e.g., forming a gap in the conductor or measurable increase in resistivity) a predetermined pattern of fuse structures. The array of fuse elements can be addressable, so selected fuse elements can be blown, and the fuse elements can be electrically connected to a programming device/and/or circuit that is configured to selectively pass sufficient current through predetermined fuse elements to form an open circuit state. Programming fuses can utilize electromigration to form a gap in the conductive material or increase the resistance by a predetermined measurable amount.

Figure 17:
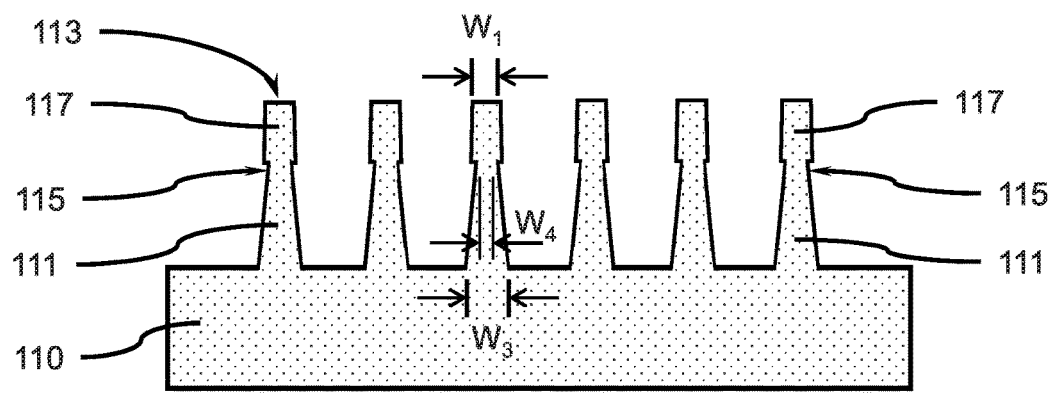
FIG. 17 is a cross-sectional side view showing thinned vertical fins after removal of the fin cap from each vertical fin, in accordance with an embodiment of the present invention.

FIG. 17 is a cross-sectional side view showing thinned vertical fins after removal of the fin cap from each vertical fin, in accordance with an embodiment of the present invention.

In one or more embodiments, the fin cap 181, which can include the capping layer 180 and fin template 121, on a vertical fin 111 can be removed by a selective isotropic etch (e.g., a wet etch). The non-reduced upper portion 117 of the vertical fin 111 can be exposed by removal of the fin cap 181. Removal of the fin cap 181 from the upper portion of the vertical fin 111 can leave the entire vertical fin exposed for formation of a subsequent conformal layer.

Figure 18:
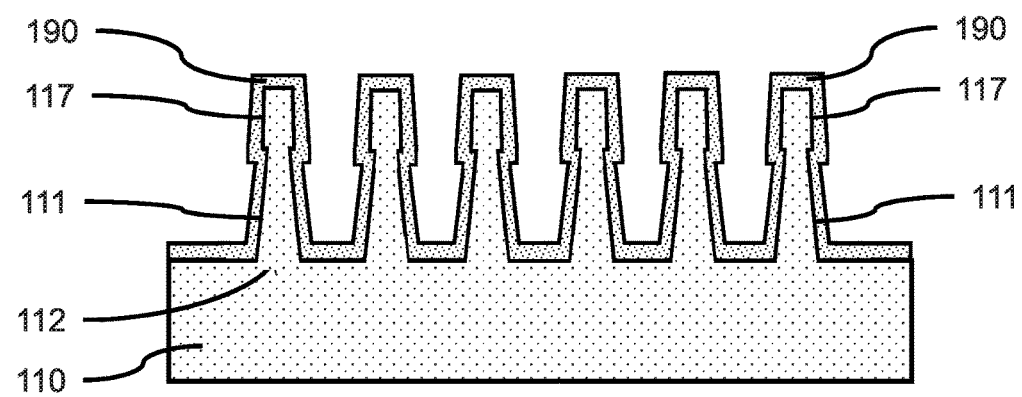
FIG. 18 is a cross-sectional side view showing an amalgamation layer formed on the vertical fins having a fuse structure and exposed substrate surface, in accordance with an embodiment of the present invention.

FIG. 18 is a cross-sectional side view showing an amalgamation layer formed on the vertical fins having a fuse structure and exposed substrate surface, in accordance with an embodiment of the present invention.

In one or more embodiments, an amalgamation layer 190 can be formed on the exposed surfaces of the vertical fin(s) 111 and substrate 110, where the amalgamation layer 190 can be a metal that forms a silicide with the material of the vertical fin(s) 111. The amalgamation layer 190 can be conformally formed on the exposed surfaces of the vertical fin(s) 111 and substrate 110, for example, by ALD or PEALD, such that the amalgamation layer 190 has a uniform thickness on the vertical fin(s) and substrate surface.

In one or more embodiments, the amalgamation layer 190 can be a metal that can form a metal silicide (M-Si) with the silicon of the vertical fin(s) 111. In various embodiments, the amalgamation layer 190 can be selected from the group consisting of titanium (Ti), nickel (Ni), cobalt (Co), molybdenum (Mo), platinum (Pt), tungsten (W), tantalum (Ta), or suitable combinations thereof.

In one or more embodiments, the amalgamation layer 190 has a thickness in the range of about 2 nm to about 30 nm, or in the range of about 3 nm to about 10 nm. The thickness of the of the amalgamation layer 190 can be related to the width and volume of the vertical fin 111, where the thickness of the amalgamation layer 190 can be sufficient to convert the entire volume of a vertical fin 111 to a silicide or only a portion of the vertical fin 111 to a silicide.

Figure 19:
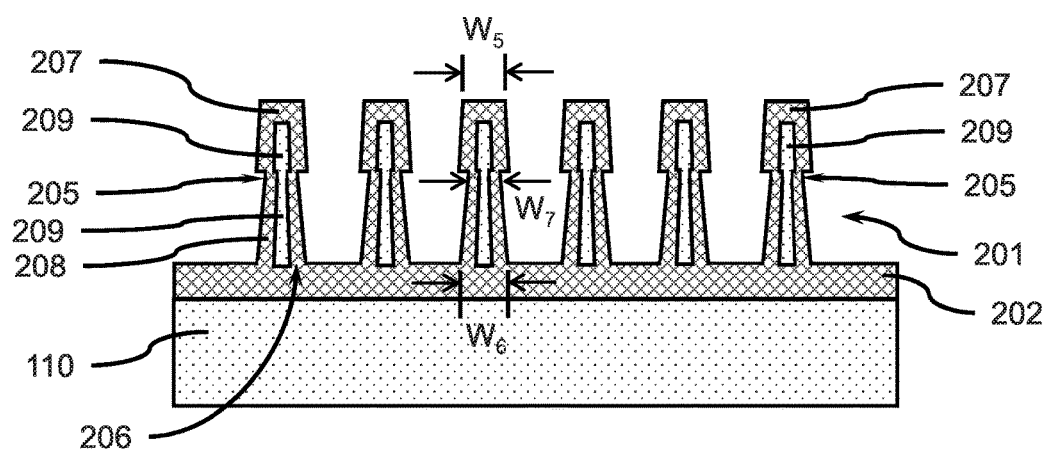
FIG. 19 is a cross-sectional side view showing the vertical fins converted to conductive silicide pillars and a surface region of the substrate converted to a conductive silicide base by a heat treatment, in accordance with an embodiment of the present invention.

FIG. 19 is a cross-sectional side view showing the vertical fins converted to conductive silicide pillars and a surface region of the substrate converted to a conductive silicide base by a heat treatment, in accordance with an embodiment of the present invention.

In one or more embodiments, the amalgamation layer 190, vertical fin(s) 111, and substrate 110 can be heat treated to allow the materials of the amalgamation layer 190, vertical fin(s) 111, and substrate surface to inter-diffuse. The amalgamation layer 190 can react with the vertical fin(s) 111 and substrate 110 to convert the neighboring portion of the vertical fin(s) into conductive silicide pillar(s) 201 and the neighboring portion of the substrate into a conductive silicide base 202, where the amalgamation layer 190 can be a silicide-forming metal layer. Unreacted portions of the amalgamation layer 190 can be selectively removed after the silicide formation, where the unreacted portions can be removed by a selective etch. In various embodiments, the entire vertical fin 111 can be converted into a metal silicide. In various embodiments, only an outer shell 208 of the vertical fin 111 may be converted into a metal silicide, where the conductive silicide pillar(s) 201 can include a remaining fin core 209 of the vertical fin material. The conductive silicide pillar(s) 201 can retain the fuse structure previously formed in the vertical fin(s) 111, including a pillar neck region 205. The narrow pillar neck region 205 functions as a fuse portion. The wider regions 206 and 207 function as the anode and cathode of the fuse. When applying a voltage bias between the anode and the cathode to cause a current to flow from the anode, through the fuse portion, to the cathode, the narrow neck region 205 increases current density, thus increasing the electromigration. By reducing the width of the electromigrated region in the fuse portion (neck region), the current density and the temperature increases in the electromigrated region during electrical programming of the fuse (i.e., opening the circuit).

In one or more embodiments, the reaction of the amalgamation layer 190 with the vertical fin(s) 111 and substrate surface can alter the width of the vertical fin(s) 111 due to incorporation of the amalgamation layer material, while retaining the fuse structure. In various embodiments, the conductive silicide pillar(s) 201 can have an upper portion 207 with a width, $W_5$, which can be larger than the original width, $W_1$, of the vertical fin; a neck region 205 with a width, $W_7$, which can be wider than original width, $W_4$; and a base region 206 with a width, $W_6$, which can be wider than the original width $W_3$. In various embodiments, $W_7 < W_5$, and $W_7 \leq W_6$, where the sidewalls of the conductive silicide pillar(s) 201 can be straight or tapered.

In one or more embodiments, the width, $W_5$, of the upper portion 207 of the conductive silicide pillar 201 can be in the range of about 10 nm to about 60 nm, and the width, $W_7$, of the neck region 205 of the conductive silicide pillar is less than the width, $W_5$, of the upper portion 207 of the conductive silicide pillar by about 5 nm to about 40 nm. In various embodiments, the conductive silicide pillar 201 can have a height in the range of about 20 nm to about 150 nm, or in the range of about 30 nm to about 100 nm, or about 45 nm to about 60 nm.

In one or more embodiments, the conductive silicide base 202 can have a thickness (i.e., depth) greater than the width, $W_7$, of the pillar neck region 205, where the material of the amalgamation layer 190 may diffuse to a depth greater than the width, $W_7$, during a heat treatment. The conductive silicide base 202 can have a thickness greater than the width, $W_7$, such that the pillar neck region 205 is the narrowest region through which current flowing through a fuse element passes.

In one or more embodiments, at least a portion of the conductive silicide pillar(s) 201 and conductive silicide base 202 can be titanium silicide (TiSi), nickel silicide (NiSi), cobalt silicide (CoSi), molybdenum silicide (MoSi), platinum silicide (PtSi), tungsten silicide (WSi), tantalum silicide (TaSi), or suitable combinations thereof.

In one or more embodiments, the thickness of the amalgamation layer 190 can be great enough to supply sufficient metal to convert the entire vertical fin 111 to a metal-silicide (M-Si) material. In various embodiments, the amalgamation layer 190 can have a thickness less than an amount sufficient to convert the entire vertical fin 111 to a metal-silicide material, where a fin core 209 of the vertical fin material can remain within the outer silicide shell 208 of the conductive silicide pillar(s) 201. The metal silicide shell 208 can surround the fin core 209, where the fin core 209 can have a higher resistivity than the metal silicide shell 208.

In one or more embodiments, the conversion of a silicon vertical fin 111 to a conductive silicide pillar 201 changes the resistivity from a range of about $1 \times 10^{-5}$ $\Omega$-m to about 0.1 $\Omega$-m to a range of about $1 \times 10^{-7}$ $\Omega$-m to about $3 \times 10^{-6}$ $\Omega$-m for the metal silicide.

In various embodiments, the vertical fin 111 and resulting fin core 209 can be doped or undoped single crystal silicon, where the doped or undoped single crystal silicon has a higher resistivity than the metal silicide. A doped silicon fin core 209 can be utilized to provide increased electromigration of a metal-silicide shell 208. A current can pass through a silicide outer shell 208 resulting in electromigration of the silicide, whereas the fin core 209 can remain, but has a measurably higher resistance than the silicide outer shell 208. A gap can form in the outer shell 208 causing a drop in current flow. In various embodiments, the difference in resistance between the silicide outer shell 208 and the fin core 209 can be at least 10%.

In one or more embodiments, the conductive silicide pillar(s) 201 can have a pillar neck region 205 that is narrower than the width of an upper portion 207 of the conductive silicide pillar(s) 201, as measured at a cross-section parallel with the plane of the substrate. The base 206 of the conductive silicide pillar 201 can be in contact with the conductive silicide base 202, and an upper portion 207 can be at the distal end of the conductive silicide pillar 201 away from the conductive silicide base 202. The metal silicide shell 208 can surround the fin core 209 and form an electrical path having a lower resistance than the material of the vertical fin 111 from the upper portion 207, through the pillar neck region 205, to the conductive silicide base 202 or conductive silicide base segments 204.

In a non-limiting exemplary embodiment, the amalgamation layer 190 is a nickel (Ni) layer deposited on the exposed surfaces of the substrate 110 and vertical fin(s) 111 to a thickness of 5 nm, where the upper portion 117 of the vertical fin has a width, $W_1$, of about 20 nm, the neck region 115 has a width, $W_4$, of about 8 nm, and the base 112 of the vertical fin has a width, $W_3$, of about 20 nm. After reacting the amalgamation layer 190 with the vertical fin(s) 111 and substrate 110, to form a conductive silicide base 202 and conductive silicide pillar(s) 201, the conductive silicide pillar(s) 201 can have an upper portion 207 with a width, $W_5$, of about 30 nm, a neck region 205 with a width, $W_7$, of about 18 nm, and a base region 206 with a width, $W_6$, of about 30 nm. A silicide thickness of about 2.2 times the initial amalgamation layer thickness can be formed if the metal of the amalgamation layer is fully converted into the metal silicide. The final thickness (NiSi shell plus fin core) will increase by an amount of reacted Ni thickness. For example, the 5 nm thick amalgamation layer 190 on each sidewall can produce an 11 nm thick NiSi layer on each side of the vertical fin 111, while about 5 nm of Si is incorporated. In another example, 2 nm of Ni is converted to ~4.4 nm NiSi, then the total width increase will be about 4 nm. Note that for other metal silicides, the thickness ratio (e.g., 2.2) between silicide and metal can change, which can result in different final thicknesses from the same amalgamation layer thickness depending on the metal of the amalgamation layer 190.

In one or more embodiments, the heat treatment can be a furnace anneal, a rapid thermal anneal (RTA), a flash anneal, or any other suitable annealing technique, at a temperature in the range of about 350° C. to about 850° C. for a duration in the range of about 0.001 min. to about 60 min., where the duration of the heat treatment can be shorter for higher temperatures.

Figure 20:
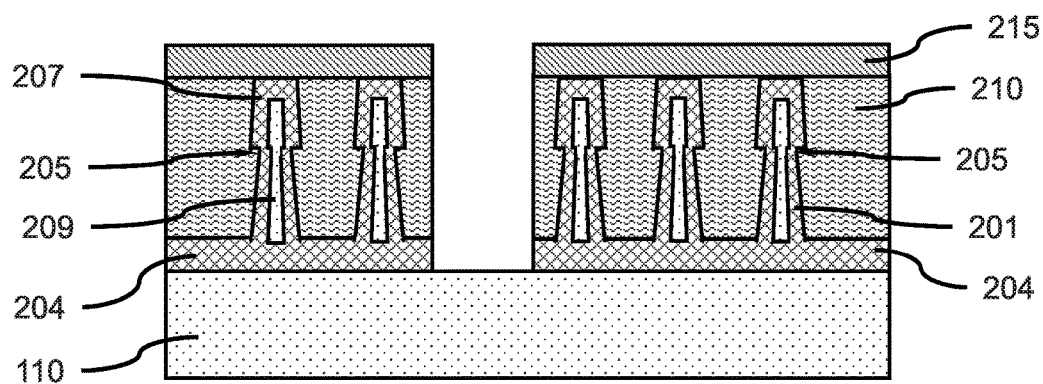
FIG. 20 is a cross-sectional side view showing the conductive silicide pillars on separate sections of the conductive silicide base after masking and removal of a portion of the silicide base, in accordance with an embodiment of the present invention.

FIG. 20 is a cross-sectional side view showing the conductive silicide pillars on separate sections of the conductive silicide base after masking and removal of a portion of the silicide base, in accordance with an embodiment of the present invention.

In one or more embodiments, the conductive silicide pillar(s) 201 can be covered by a temporary fill layer 210 and a masking layer 215, where the temporary fill layer 210 can be a flowable oxide or polymeric material, and the masking layer 215 can be an organic resist material, as would be known in the art. The temporary fill layer 210 and a masking layer 215 can be blanket deposited on the conductive silicide pillar(s) 201 and conductive silicide base 202, where the temporary fill layer 210 can fill the space between conductive silicide pillars 201.

In one or more embodiments, the masking layer 215 can be patterned and developed to expose predetermined portions of the temporary fill layer 210, where the exposed portions can be between predetermined conductive silicide pillar(s) 201, and may include one or more conductive silicide pillar(s) 201. The exposed portion(s) of the temporary fill layer 210 can be removed, for example, by a directional selective etch (e.g., RIE) that exposes the underlying portion of the conductive silicide base 202. The exposed portion(s) of the temporary fill layer 210 can be removed, for example, by a directional selective etch (e.g., RIE) that separates the conductive silicide base 202 into two or more conductive silicide base segments 204.

In one or more embodiments, the exposed conductive silicide pillar(s) 201 and conductive silicide base 202 can be removed to separate the conductive silicide base 202 into two or more conductive silicide base segments 204. In various embodiments, a single conductive silicide pillar 201 can be on a conductive silicide base segment 204, or a plurality of conductive silicide pillars 201 can be on a conductive silicide base segment 204. The conductive silicide pillars 201 can be ganged together to form multiple fuse elements in parallel to increase the current carrying capacity of the ganged fuse element. Adjusting the number of conductive silicide pillars 201 on a conductive silicide base segment 204 can vary the current used to blow the ganged fuse element, where the current carrying capacity of each individual conductive silicide pillars 201 remains the same.

In one or more embodiments, a conductive silicide pillar 201 can be on each conductive silicide base segment 204, where the base region 206 of the conductive silicide pillar 201 can be in contact with the conductive silicide base segment 204. Each conductive silicide base segment 204 can provide an electrical path to a proximal end of one or more conductive silicide pillar(s) 201. Current can flow vertically from the conductive silicide base segment 204 through the one or more conductive silicide pillar(s) 201 in electrical contact with the conductive silicide base segment 204, or vertically through the upper portion 207 of the conductive silicide pillar(s) 201 and pillar neck region 205 to the conductive silicide base segment 204. In various embodiments, the conductive silicide base segment 204 can have a lower resistance than the one or more conductive silicide pillar(s) 201 to conduct current to each conductive silicide pillar 201.

Figure 21:
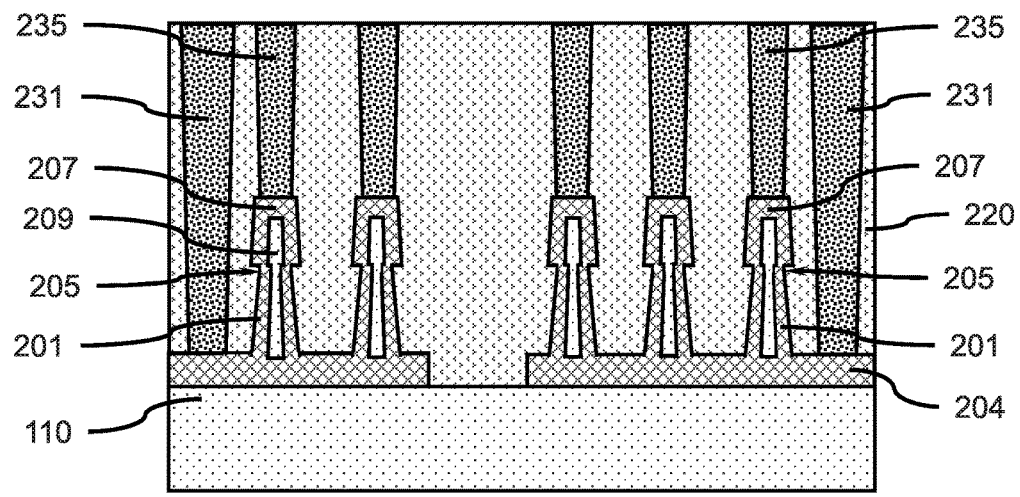
FIG. 21 is a cross-sectional side view showing metal electrodes formed to the separate conductive silicide base segments and the conductive silicide pillars, in accordance with an embodiment of the present invention.

FIG. 21 is a cross-sectional side view showing metal electrodes formed to the separate conductive silicide base segments and the conductive silicide pillars, in accordance with an embodiment of the present invention.

In one or more embodiments, the masking layer 215 and temporary fill layer 210 can be removed to expose the conductive silicide pillar(s) 201 on the separate silicide base segments 204, and intervening portions of the underlying substrate 110 using methods known in the art (e.g., stripping, ashing, etching, etc.).

In one or more embodiments, an interlayer dielectric (ILD) layer 220 can be formed on the exposed conductive silicide pillar(s) 201, separate silicide base segments 204, and intervening portions of the underlying substrate 110, where the interlayer dielectric (ILD) layer 220 can be blanket deposited to fill in the spaces between conductive silicide pillars and silicide base segments 204.

In one or more embodiments, the ILD layer 220 can be silicon oxide (SiO), a low-k dielectric, a flowable polymeric material, or a combination thereof. A low-k dielectric material can include, but not be limited to, a fluoride-doped silicon oxide (e.g., fluoride doped glass), a carbon doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof. In various embodiments, the ILD layer 220 can be formed by CVD, LPCVD, or spun on.

In one or more embodiments, the ILD layer 220 can cover the conductive silicide pillar(s) 201 and extend above the top surfaces of the conductive silicide pillar(s) 201. A chemical-mechanical polishing can be utilized to remove the ILD layer material above the top surfaces of the conductive silicide pillar(s) 201, and provide a smooth, flat surface.

In one or more embodiments, the ILD layer 220 can be masked, and vias formed in the ILD layer down to the conductive silicide pillar(s) 201 and silicide base segments 204 to form electrical paths. The electrical path can include the conductive silicide base 202 or conductive silicide base segments 204 and conductive silicide pillar(s) 201 having the fuse structure that forms a fuse element.

In one or more embodiments, the vias in the ILD layer 220 can be filled with a conductive metal to form a metal electrode(s) 231, 235 in contact with the conductive silicide base 202, conductive silicide base segments 204, and conductive silicide pillar(s) 201. The metal electrode 235 to the upper portion of the conductive silicide pillar 201 can have a smaller cross-sectional area than the metal electrode 231 to the conductive silicide base 202 or conductive silicide base segments 204, since each fuse element may carry a smaller individual current than the current that passes through the conductive silicide base 202 or conductive silicide base segments 204. The metal electrode 235 to the upper portion 207 of the conductive silicide pillar 201 can have a larger cross-sectional area than the pillar neck region 205, so the pillar neck region 205 experiences the largest current density, and the contact between the metal electrode 235 and upper portion 207 does not restrict current flow.

In one or more embodiments, the material of the metal electrode(s) 231, 235 is selected from the group consisting of tungsten (W), cobalt (Co), titanium (Ti), molybdenum (Mo), nickel (Ni), copper (Cu), and suitable combinations thereof.

While not intending to be limited by theory, it is believed that current flowing through the fuse element with a sufficient current density can cause electromigration of the silicide material, where the electromigration can be predominantly at the pillar neck region 205. The current density can provide sufficient electromigration of the metal silicide of to migrate away from this narrow region of the fuse structure until an open circuit is created, for example, by a gap being formed between the metal silicide of the upper portion 207 of the conductive silicide pillar(s) 201 and the lower portion. In various embodiments, a fin core 209 can remain, but the fin core can have a measurably greater resistance than the conductive metal-silicide forming an outer metal-silicide shell 208. In various embodiments, the current density passed through a fuse element can be sufficient to cause electromigration of the metal-silicide material to create a measurable increase in resistivity.

In various embodiments, a change in resistance in the range of at least about 10% can be measured to determine the opening of a fuse element. In various embodiments, the change in resistance can be in the range of about 10% to about 100%. In various embodiments, a blown fuse element can have a resistance of 1000Ω or more.

Figure 22:
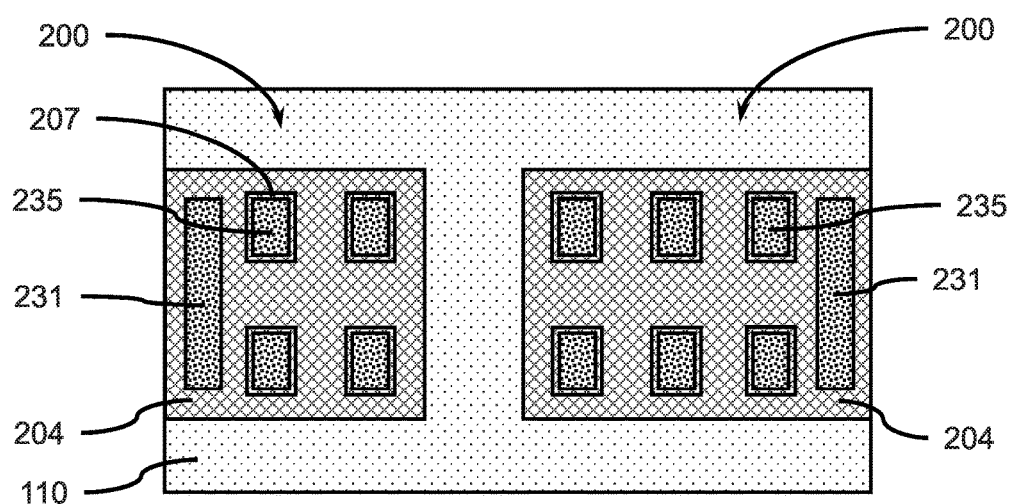
FIG. 22 is a top view showing exposed metal electrodes formed to the conductive silicide pillars and the separate conductive silicide bases on the substrate, in accordance with an embodiment of the present invention.

FIG. 22 is a top view showing exposed metal electrodes formed to the conductive silicide pillars and the separate conductive silicide bases on the substrate, in accordance with an embodiment of the present invention.

In one or more embodiments, the metal electrode(s) 231, 235 can be formed in the ILD layer 220 to provide conductive electrical paths to each of the fuse elements 200, including a conductive silicide pillar(s) 201 having a fuse structure, such that the conductive silicide pillar 201 can be blown (i.e., form an open circuit or measurable increase in resistivity) by selectively passing a current through the specific conductive silicide pillar 201. In various embodiments, each conductive silicide pillar 201 can be electrically coupled to ground though a programming circuit. The metal electrode 231 can be configured and dimensioned to carry a larger current than metal electrode 235.

Figure 23:
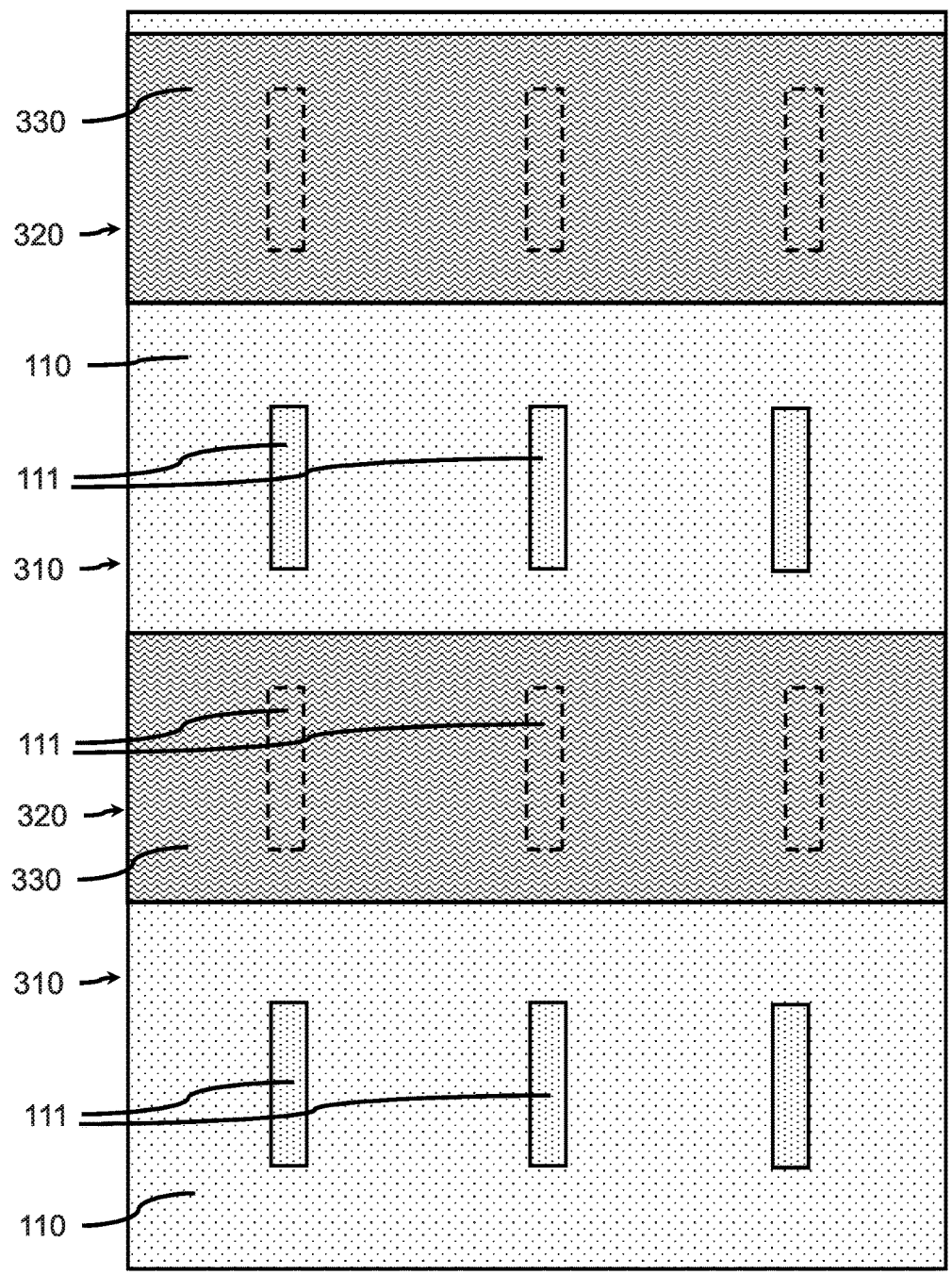
FIG. 23 is a top view of blocking layers formed on two regions of a substrate and vertical fins formed on two other regions of the substrate adjacent to at least one of the regions covered by a blocking layer, in accordance with an embodiment of the present invention.

FIG. 23 is a top view of blocking layers formed on two regions of a substrate and vertical fins formed on two other regions of the substrate adjacent to at least one of the regions covered by a blocking layer, in accordance with an embodiment of the present invention.

In one or more embodiments, a plurality of vertical fins 111 can be formed on the substrate 110, where the vertical fins 111 can be arranged as an array (e.g., a row×column array) that can be separated into two or more regions on the substrate.

In one or more embodiments, a spacer layer 170 and a masking layer can be formed on at least a portion of the substrate 110 and vertical fins 111 to form a blocking layer 330. One or more sections of the blocking layer 330 can be removed to expose the underlying vertical fins 111 in a first region 310 for forming a fuse structure and fuse element, while other vertical fins 111 in a neighboring second region 320 remains covered by the blocking layer 330.

In various embodiments, the blocking layer 330 can be patterned to form an arrangement of vertical transport fin field effect transistors on predetermined portions of the substrate 110 and fuse arrays on different predetermined portions of the substrate 110.

Figure 24:
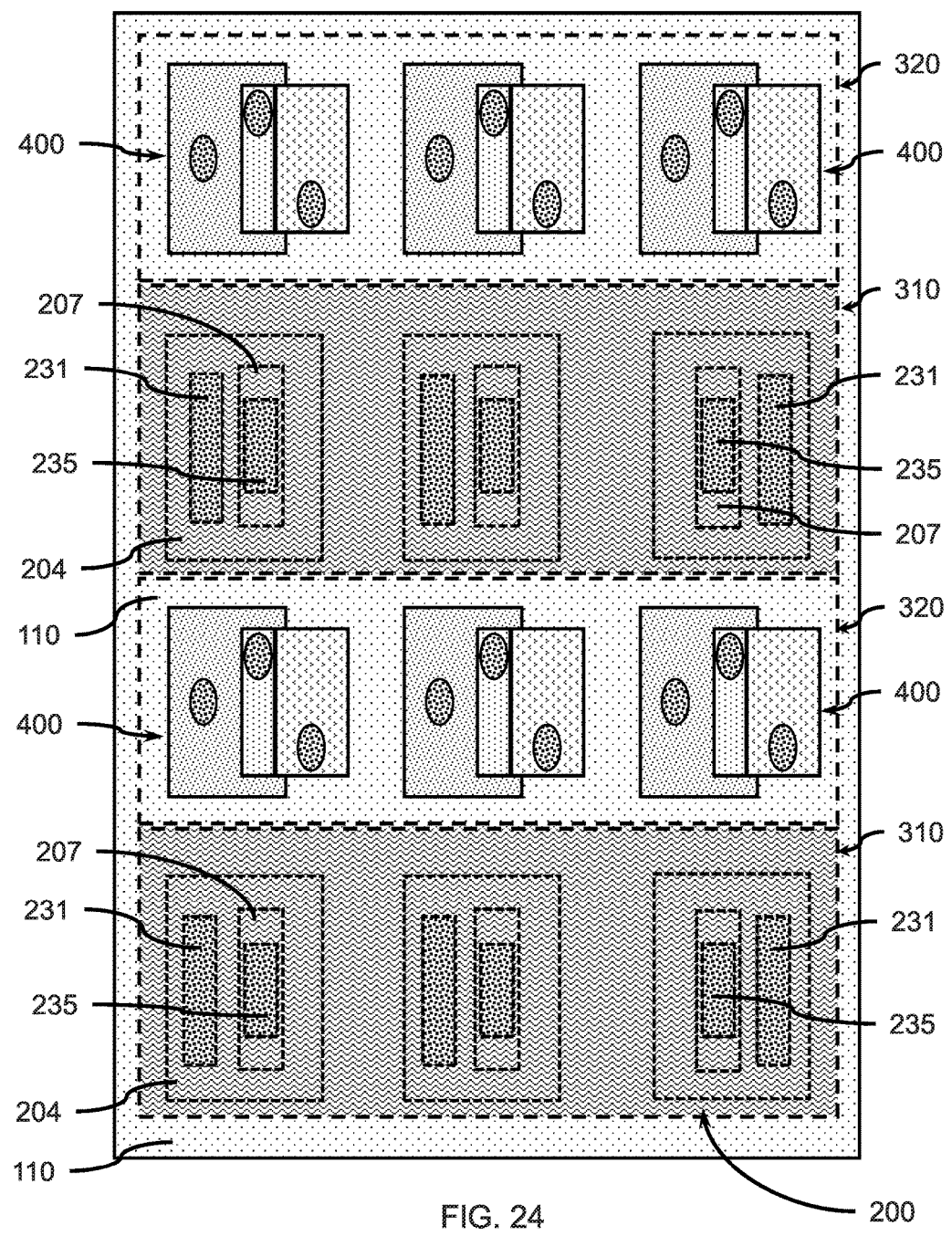
FIG. 24 is a top view of vertical FinFETs formed on two regions of a substrate and fuse elements formed on two other regions of the substrate adjacent to at least one of the regions having vertical FinFETs, in accordance with an embodiment of the present invention.

FIG. 24 is a top view of vertical FinFETs formed on two regions of a substrate and fuse elements formed on two other regions of the substrate adjacent to at least one of the regions having vertical FinFETs, in accordance with an embodiment of the present invention.

In one or more embodiments, the portions of the blocking layer 330 can be removed from the second region 320 on the substrate to exposed the previously protected vertical fins 111, while a blocking layer can be formed on the conductive silicide base 202, conductive silicide base segments 204, and conductive silicide pillar(s) 201 on the first region 310 of the substrate.

In various embodiments, additional front-end fabrication processes can be utilized to fabricate one or more FinFETS 400 from the previously covered vertical fins 111, where the FinFETS 400 are on the second region(s) 320 of the substrate adjacent to the first regions 310. The vertical finFETS can be n-type FinFETs, p-type FinFETs, or a combination thereof to form CMOS devices. The FinFET can have current flow vertically or horizontally, such that the FinFETs are vertical or horizontal transport FinFETs. The FinFETs can be part of the programming circuit for addressing the conductive silicide pillar(s) 201, a logic device, memory devices, or a combination thereof. The fin field effect transistor(s) 400 on the second region 320 of the substrate 100 can form a logic circuit, a memory circuit, or a combination thereof, and at least one conductive silicide pillars having a fuse structure is electrically coupled to the logic circuit, the memory circuit, or the combination thereof.

In a non-limiting exemplary embodiment, an array of vertical fuse elements 200 can be formed on a first region 310 of a substrate 110 adjacent to a second region 320 of the substrate having fin field effect transistors 400 by forming a plurality of vertical fins 111 on the substrate 110; forming a blocking layer 330 on the plurality of vertical fins; removing a portion of the blocking layer 330 from a first region 310 of the substrate to expose one or more vertical fins 111 on the first region of the substrate, where the first region 310 is adjacent to a second region 320 of the substrate 110 having one or more vertical fins covered by a remaining portion of the blocking layer 330; forming a fin cap 181 on each of the exposed one or more vertical fins 111, where a lower portion of the one or more vertical fins remains exposed after formation of the fin cap(s) 181 on each of the exposed one or more vertical fins 111; reacting the exposed lower portion of the one or more vertical fins to form a sacrificial layer 119 on the exposed lower portion of each of the one or more vertical fins 111; and removing the sacrificial layer 119 from the lower portion of each of the one or more vertical fins to form a neck region 115 in each of the one or more vertical fins 111.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or including, when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above" "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vertical fuse element, comprising:
a conductive silicide base on a surface of a substrate; and
a conductive silicide pillar extending in a direction perpendicular to the surface of the substrate, where the conductive silicide pillar is on the conductive silicide base, and wherein the conductive silicide pillar includes an upper portion having a width, $W_5$, a base having a width, $W_6$, and a neck region having a width, $W_7$, where $W_7 < W_5$, and $W_7 \leq W_6$.

2. The vertical fuse element of claim 1, further comprising, a first metal electrode in physical and electrical contact with the conductive silicide base, and
a second metal electrode in physical and electrical contact with the upper portion of the conductive silicide pillar, where the material of the metal electrodes is selected from the group consisting of tungsten (W), cobalt (Co), titanium (Ti), molybdenum (Mo), nickel (Ni), copper (Cu), tantalum (Ta), ruthenium (Ru), zirconium (Zr), aluminum (Al), platinum (Pt), silver (Ag), gold (Au), tantalum nitride (TaN), titanium nitride (TiN), tantalum carbide (TaN), titanium carbide (TiC), titanium aluminum carbide (TiAlC), and suitable combinations thereof.

3. The vertical fuse element of claim 1, wherein the material of the conductive silicide pillar is titanium silicide (TiSi), nickel silicide (NiSi), cobalt silicide (CoSi), molybdenum silicide (MoSi), platinum silicide (PtSi), tungsten silicide (WSi), tantalum silicide (TaSi), or suitable combinations thereof.

4. The vertical fuse element of claim 1, wherein the conductive silicide pillar includes an outer silicide shell and a fin core.

5. The vertical fuse element of claim 1, wherein the width, $W_5$, of the upper portion of the conductive silicide pillar is in the range of about 20 nm to about 60 nm.

6. The vertical fuse element of claim 5, wherein the width, $W_7$, of the neck region of the conductive silicide pillar is less than the width, $W_5$, of the upper portion of the conductive silicide pillar by about 5 nm to about 40 nm.

7. The vertical fuse element of claim 5, wherein the width, $W_7$, of the neck region of the conductive silicide pillar is in the range of about 5 nm to about 15 nm.

8. The vertical fuse element of claim 5, wherein the conductive silicide pillar has a height in the range of about 20 nm to about 150 nm.

9. The vertical fuse element of claim 5, wherein the conductive silicide pillar is on a first region of the substrate adjacent to a second region of the substrate including a vertical transport fin field effect transistor.

10. A method of forming a vertical fuse element, comprising:
forming a vertical fin on a substrate;
forming a fin cap on the vertical fin, where the fin cap covers an upper portion of the vertical fin and leaves a lower portion of the vertical fin exposed; and
reducing the width of the lower portion of the vertical fin to form a neck region between the upper portion and the lower portion of the vertical fin.

11. The method of forming a vertical fuse element of claim 10, further comprising, removing the fin cap from the vertical fin, and forming an amalgamation layer on the vertical fin.

12. The method of forming a vertical fuse element of claim 11, further comprising, heat treating the amalgamation layer to form a conductive silicide pillar.

13. The method of forming a vertical fuse element of claim 12, wherein the amalgamation layer is titanium (Ti), nickel (Ni), cobalt (Co), molybdenum (Mo), platinum (Pt), tungsten (W), tantalum (Ta), or suitable combinations thereof.

14. The method of forming a vertical fuse element of claim 12, further comprising reducing the width of the lower portion of the vertical fin by forming a sacrificial layer on the exposed lower portion of the vertical fin, and removing the sacrificial layer from the lower portion of the vertical fin to form the neck region between the upper portion and the lower portion of the vertical fin; or
etching the lower portion of the vertical fin to remove a predetermined thickness of the lower portion of the vertical fin.

15. The method of forming a vertical fuse element of claim 12, wherein
the conductive silicide pillar has a resistivity in the range of about $1 \times 10^{-7}$ Ω-m to about $3 \times 10^{-6}$ Ω-m.

16. A method of forming an array of vertical fuse elements on a first region of a substrate adjacent to a second region of the substrate having fin field effect transistors, comprising:
forming a plurality of vertical fins on the substrate;
forming a blocking layer on the plurality of vertical fins;
removing a portion of the blocking layer from the first region of the substrate to expose one or more vertical fins on the first region of the substrate, where the first region is adjacent to the second region of the substrate having one or more vertical fins covered by a remaining portion of the blocking layer;
forming a fin cap on each of the exposed one or more vertical fins, where a lower portion of the one or more vertical fins remains exposed after formation of the fin cap(s) on each of the exposed one or more vertical fins;
reacting the exposed lower portion of the one or more vertical fins to form a sacrificial layer on the exposed lower portion of each of the one or more vertical fins; and
removing the sacrificial layer from the lower portion of each of the one or more vertical fins to form a neck region in each of the one or more vertical fins.

17. The method of forming an array of vertical fuse elements on a first region of a substrate adjacent to a second region of the substrate having fin field effect transistors of claim 16, further comprising, removing the fin cap from each of the one or more vertical fins, and forming an amalgamation layer on each of the one or more vertical fins, and heat treating the amalgamation layer to convert each of the one or more vertical fins to a conductive silicide pillar.

18. The method of forming an array of vertical fuse elements on a first region of a substrate adjacent to a second region of the substrate having fin field effect transistors of claim 17, further comprising, forming a metal electrode to each of the one or more conductive silicide pillar(s) on the first region of the substrate.

19. The method of forming an array of vertical fuse elements on a first region of a substrate adjacent to a second region of the substrate having fin field effect transistors of claim 18, further comprising:

forming a blocking layer on the one or more conductive silicide pillar(s) on the first region of the substrate;

removing the remaining portion of the blocking layer from the second region of the substrate to expose the one or more vertical fins; and fabricating a fin field effect transistor from each of the one or more vertical fins on the second region of the substrate.

20. The method of forming an array of vertical fuse elements on a first region of a substrate adjacent to a second region of the substrate having fin field effect transistors of claim 19, where the fin field effect transistor(s) on the second region of the substrate form a logic circuit, a memory circuit, or a combination thereof, and at least one conductive silicide pillars is electrically coupled to the logic circuit, the memory circuit, or the combination thereof.

* * * * *